United States Patent
Abou-Kandil et al.

(10) Patent No.: US 8,900,538 B2
(45) Date of Patent: Dec. 2, 2014

(54) DOPED, PASSIVATED GRAPHENE NANOMESH, METHOD OF MAKING THE DOPED, PASSIVATED GRAPHENE NANOMESH, AND SEMICONDUCTOR DEVICE INCLUDING THE DOPED, PASSIVATED GRAPHENE NANOMESH

(75) Inventors: Ahmed Abou-Kandil, Elmsford, NY (US); Ahmed Maarouf, Mohegan Lake, NY (US); Glenn J. Martyna, Croton on Hudson, NY (US); Hisham Mohamed, Clifton Park, NY (US); Dennis M. Newns, Yorktown Heights, NY (US)

(73) Assignees: International Business Machines Corporation, Armonk, NY (US); Egypt Nanotechnology Center, Giza (EG)

( * ) Notice: Subject to any disclaimer, the term of this patent is extended or adjusted under 35 U.S.C. 154(b) by 137 days.

(21) Appl. No.: 13/194,976

(22) Filed: Jul. 31, 2011

(65) Prior Publication Data
US 2013/0028823 A1 Jan. 31, 2013

(51) Int. Cl.
| | |
|---|---|
| *C01B 31/00* | (2006.01) |
| *C01B 35/18* | (2006.01) |
| *C01D 15/00* | (2006.01) |
| *H01L 29/16* | (2006.01) |
| *H01L 29/78* | (2006.01) |
| *C01B 31/04* | (2006.01) |

(52) U.S. Cl.
CPC ........ *C01B 31/0484* (2013.01); *H01L 29/1606* (2013.01); *H01L 29/78* (2013.01)
USPC .......................... 423/276; 423/414; 423/415.1

(58) Field of Classification Search
CPC ........ B82Y 10/00; B82Y 25/00; B82Y 40/00; C01B 31/0446; C01B 31/0484
USPC .................................................. 428/336, 402
See application file for complete search history.

(56) References Cited

U.S. PATENT DOCUMENTS

| | | | |
|---|---|---|---|
| 2005/0075498 A1* | 4/2005 | Kim et al. ..................... | 540/472 |
| 2008/0272397 A1 | 11/2008 | Koudymov et al. | |
| 2009/0174435 A1* | 7/2009 | Stan et al. ..................... | 977/755 |

(Continued)

FOREIGN PATENT DOCUMENTS

| | | |
|---|---|---|
| WO | WO2009148679 A2 | 12/2009 |
| WO | WO2009158117 A2 | 12/2009 |
| WO | WO2010036210 A1 | 4/2010 |

OTHER PUBLICATIONS

X. Li, et al., "Large-Area Synthesis of High-Quality and Uniform Graphene Films on Copper Foils", Science, vol. 324, 2009, pp. 1312-1314.

(Continued)

*Primary Examiner* — David Vu
*Assistant Examiner* — Jonathan Han
(74) *Attorney, Agent, or Firm* — Vazken Alexanian; McGinn IP Law Group, PLLC

(57) ABSTRACT

A method of making a semiconductor device, includes providing a graphene sheet, creating a plurality of nanoholes in the graphene sheet to form a graphene nanomesh, the graphene nanomesh including a plurality of carbon atoms which are formed adjacent to the plurality of nanoholes, passivating a dangling bond on the plurality of carbon atoms by bonding a passivating element to the plurality of carbon atoms, and doping the passivated graphene nanomesh by bonding a dopant to the passivating element.

20 Claims, 10 Drawing Sheets

(56) References Cited

U.S. PATENT DOCUMENTS

| | | | |
|---|---|---|---|
| 2010/0075139 A1* | 3/2010 | Kato et al. | 428/336 |
| 2010/0105834 A1* | 4/2010 | Tour et al. | 977/752 |
| 2010/0218801 A1 | 9/2010 | Sung et al. | |
| 2010/0243021 A1* | 9/2010 | Lee et al. | 438/73 |
| 2011/0274928 A1* | 11/2011 | Liu | 977/774 |

OTHER PUBLICATIONS

J. Bai et al. "Graphene Nanomesh", Nature Nanotechnology, vol. 5, pp. 190-194, 2010.

R. Martinazzo et al., "Symmetry-induced band-gap opening in graphene superlattices", Physical Review B, vol. 81, No. 24, 245420, 2010.

T. Pedersen et al., "Graphene Antidot Lattices: Designed Defects and Spin Qubits", Phys. Rev. Lett., vol. 100, 2008, 136804.

D. W. Boukhalov et al., "Tuning the gap in bilayer graphene using chemical functionalization: Density functional calculations", Phys. Rev. B, vol. 78, 2008, 085413.

J. H. Chen et al., "Charged Impurity Scattering in Graphene", Nature Physics, vol. 4, 2008, pp. 377-381.

K. Friess et al., "Transport properties of polyimides containing cucurbit[6]uril", Desalination 200 (2006) pp. 236-238.

* cited by examiner

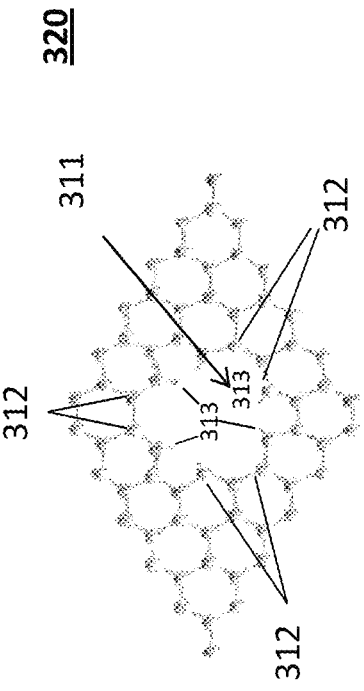
Figure 3A
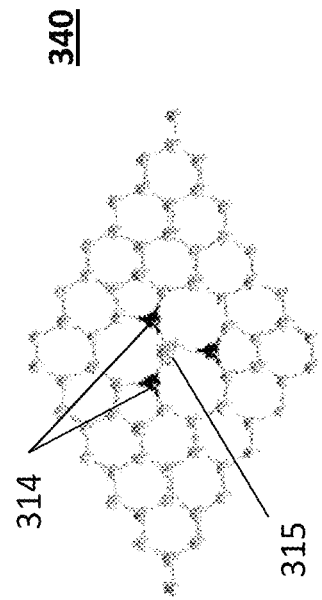
Figure 3B
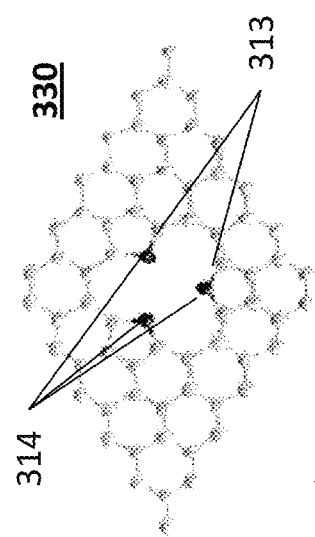
Figure 3C
Figure 3D

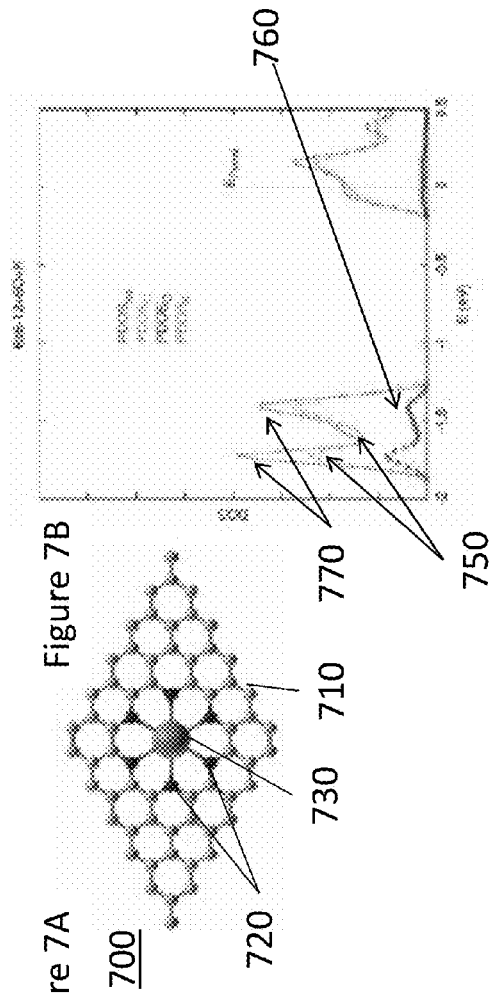
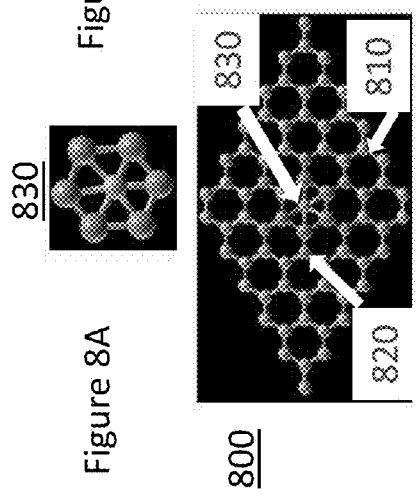
Figure 7A
Figure 7B
Figure 8A
Figure 8B

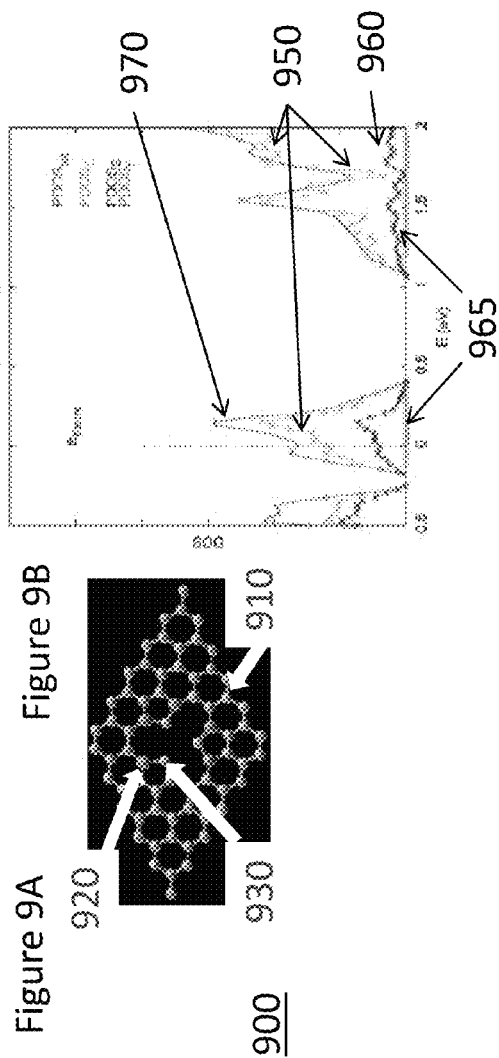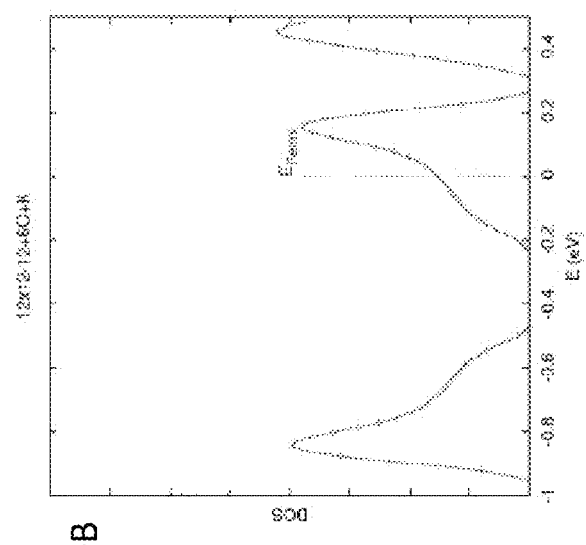
Figure 9A
Figure 9B
900
Figure 10A
Figure 10B
1000

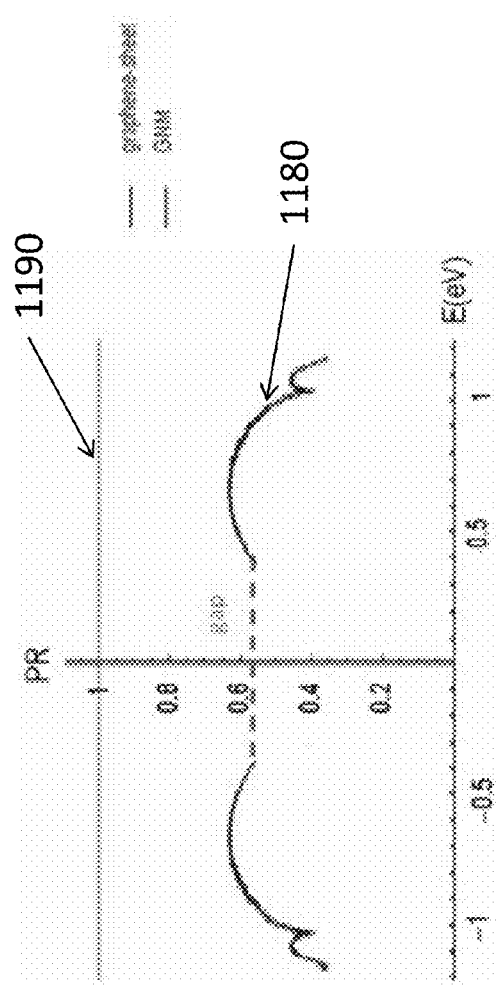
Figure 11
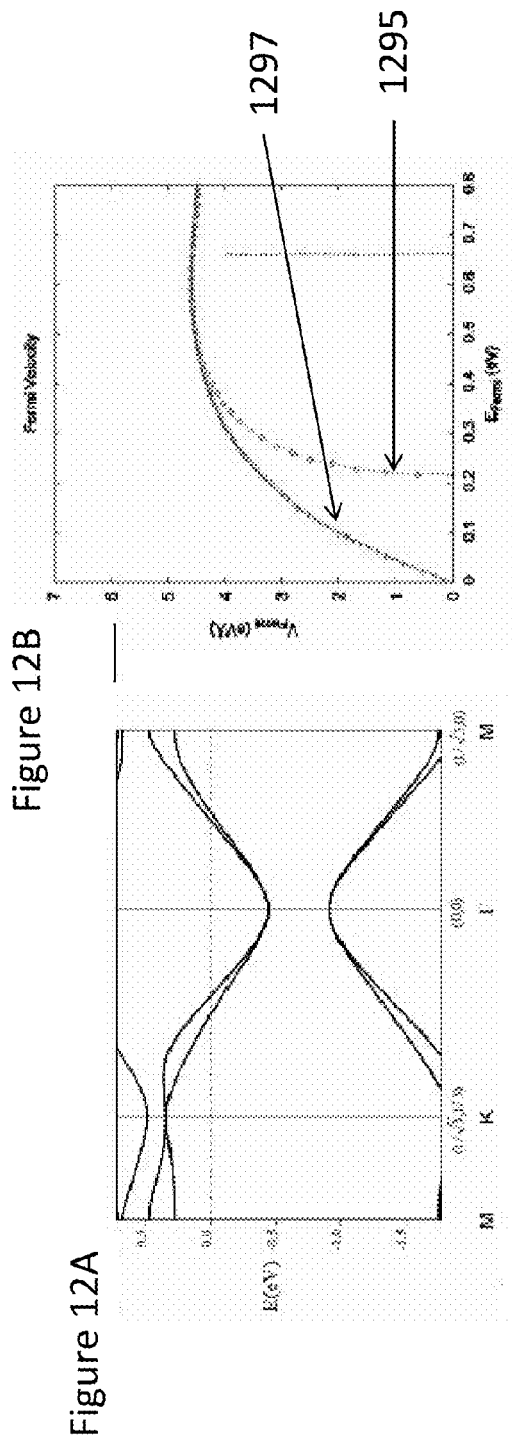
Figure 12A
Figure 12B

DOPED, PASSIVATED GRAPHENE NANOMESH, METHOD OF MAKING THE DOPED, PASSIVATED GRAPHENE NANOMESH, AND SEMICONDUCTOR DEVICE INCLUDING THE DOPED, PASSIVATED GRAPHENE NANOMESH

BACKGROUND OF THE INVENTION

1. Field of the Invention

The present invention relates generally to a doped, passivated graphene nanomesh, and more particularly, a doped, passivated graphene nanomesh which includes a passivating element and a dopant bonded to the passivating element.

2. Description of the Related Art

Current technology depends on decreasing the size of the transistor to make computers more powerful, faster and more energy efficient. As current efforts approach the miniaturization limit (the size of a single atom), alternative technologies are needed to continue improving integrated circuit performance. Optimization is carried on multiple fronts such as developing alternative architectures, new materials, new algorithms and new software.

FIG. 1A illustrates a graphene sheet 110, according to an exemplary aspect of the present invention. Graphene is a candidate material for semiconductor fabrication. It is a hexagonal lattice (e.g., a honeycomb) of carbon atoms (e.g., a two-dimensional network of single layer carbon atoms). It is a semimetal in that its conduction and valence bands just meet at discrete points in the Brillouin zone. It is an interesting of mix of semiconductor (zero density of states) and metal (zero bandgap).

An electron in graphene has an effective mass of zero and behaves more like a photon than a conventional massive particle. Graphene can carry huge current densities—about $10^8$ A/cm$^2$, which is roughly two orders of magnitude greater than copper.

A graphene layer may be epitaxially grown on any lattice-matched material, and has been used for many electronic applications. Such applications require the graphene to be doped to make it a semiconducting material. Conventionally, graphene is doped by adsorbing volatile compounds to its surface.

FIG. 1B illustrates a conventional field effect transistor (FET) 100 which includes the graphene sheet 110 (e.g., a graphene layer 110) epitaxially formed on and lattice-matched to, a single crystal insulative layer 120.

Separate portions of layer 110 form source region 110a and drain region 110b. Schematically depicted source and drain electrodes $V_s$ and $V_d$, respectively, make electrical contact with source and drain regions 110a and 110b. A third portion of layer 110 forms a channel region 110c, which couples the source and drain regions to one another. The channel region 110c may include, for example, a doped graphene layer.

As is well known in the semiconductor and graphene device arts, the resistance/conductance of the channel region 110c is controlled by a gate 130 which includes a patterned gate insulator 130a disposed on channel region 110c and a gate electrode 130b formed on gate insulator 130a. Finally, a common (often grounded) electrode 140 is formed on the bottom of insulative layer 120.

In operation, when suitable voltages $V_s$ and $V_d$ are applied to the source and drain electrodes, respectively, current flows or is inhibited from the source region 110a to the drain region 110b (or conversely) depending on the gate voltage applied between electrodes 130b and 140. When the gate voltage $V_g$ is sufficient to reduce electron transport by depleting the channel region 110c, the channel resistance increases and current flow decreases, and conversely.

SUMMARY OF THE INVENTION

In view of the foregoing and other problems, disadvantages, and drawbacks of the aforementioned conventional systems and methods, an exemplary aspect of the present invention is directed to a method of making a semiconductor device including a doped, passivated graphene nanomesh.

An exemplary aspect of the present invention is directed to a method of making a semiconductor device, including providing a graphene sheet, creating a plurality of nanoholes in the graphene sheet to form a graphene nanomesh, the graphene nanomesh including a plurality of carbon atoms which are formed adjacent to the plurality of nanoholes, passivating a dangling bond on the plurality of carbon atoms by bonding a passivating element to the plurality of carbon atoms; and doping the passivated graphene nanomesh by bonding a dopant to the passivating element.

Another exemplary aspect of the present invention is directed to a doped, passivated graphene nanomesh, including a graphene nanomesh including a plurality of nanoholes formed in a graphene sheet, and a plurality of carbon atoms which are formed adjacent to the plurality of nanoholes, a passivating element bonded to the plurality of carbon atoms, and a dopant bonded to the passivating element.

Another exemplary aspect of the present invention is directed to a method of making a doped, passivated graphene nanomesh, including providing a graphene sheet, creating a plurality of nanoholes in the graphene sheet to form a graphene nanomesh, the graphene nanomesh including a plurality of carbon atoms which are formed adjacent to the plurality of nanoholes, the plurality of nanoholes including a lattice configuration having a periodicity for opening a band gap in an electronic spectrum of the nanomesh, and the periodicity including a hole-hole separation given by 3×N×A, where N is an integer and A is the lattice constant for the lattice configuration, passivating a dangling bond on the plurality of carbon atoms by bonding a passivating element to the plurality of carbon atoms, and doping the passivated graphene nanomesh by bonding a dopant to the passivating element, the bonding of the dopant to the passivating element including a chelation process which forms a ring including the passivating element, the dopant, and a carbon atom of the plurality of carbon atoms. The doping (e.g., ultra-stable doping) of the graphene nanomesh includes controlling a level of doping by one of passivating all of the plurality of nanoholes and doping less than all of the passivated plurality of nanoholes, and controlling a lattice constant of the plurality of nanoholes. Further, with the ultra-stable doping (e.g., due to the chemical binding), the exemplary aspects of the present invention may help to overcome the problem of dopant fluctuation, which is present in conventional methods.

With its unique and novel features, the present invention may provide a method of making a semiconductor device including a doped, passivated graphene nanomesh, which may provide ultra-stable doping of the graphene nanomesh.

BRIEF DESCRIPTION OF THE DRAWINGS

The foregoing and other objects, aspects and advantages will be better understood from the following detailed description of the embodiments of the invention with reference to the drawings, in which:

FIG. 3A illustrates a graphene sheet 310 in the method 200 of making a semiconductor device (e.g., a doped, passivated graphene nanomesh (DP-GNM)), according to an exemplary aspect of the present invention;

FIG. 3B illustrates a graphene nanomesh 320 in the method 200 of making a semiconductor device (e.g., a doped, passivated graphene nanomesh (DP-GNM)), according to an exemplary aspect of the present invention;

FIG. 3C illustrates a passivated graphene nanomesh 330 in the method 200 of making a semiconductor device (e.g., a doped, passivated graphene nanomesh (DP-GNM)), according to an exemplary aspect of the present invention;

FIG. 3D illustrates a doped, passivated graphene nanomesh 340 in the method 200 of making a semiconductor device (e.g., a doped, passivated graphene nanomesh (DP-GNM)), according to an exemplary aspect of the present invention;

FIG. 7A illustrates a doped, passivated graphene nanomesh (DP-GNM) 700 formed by potassium ion chelation, according to an exemplary aspect of the present invention.

FIG. 7B provides a graph illustrating the DOS of the potassium-doped GNM 700, according to an exemplary aspect of the present invention;

FIG. 8A illustrates a $CB_6$ doped GNM 800, according to an exemplary aspect of the present invention;

FIG. 8B provides a graph illustrating the DOS of the $CB_6$-doped GNM 800, according to an exemplary aspect of the present invention;

FIG. 9A illustrates a boron-fluorine doped GNM 900, according to an exemplary aspect of the present invention;

FIG. 9B illustrates the DOS of the Boron-Fluorine-doped GNM 900, according to an exemplary aspect of the present invention;

FIG. 10A illustrates a potassium-doped (e.g., n-doped) GNM 1000, according to an exemplary aspect of the present invention;

FIG. 10B provides a graph illustrating the DOS of the potassium-doped GNM 1000, according to an exemplary aspect of the present invention;

FIG. 11 provides a graph including a first plot 1180 which plots the participation ratio for a n-doped GNM system, and a second plot 1190 which plots the participation ratio for pristine graphene;

FIG. 12A provides a graph illustrating the band structure of an n-doped passivated GNM, according to an exemplary aspect of the present invention;

FIG. 12B provides a graph in which the Fermi velocity of the electrons (e.g., for graphene and the n-doped passivated GNM) is plotted as a function of energy, according to an exemplary aspect of the present invention;

DETAILED DESCRIPTION OF THE EXEMPLARY EMBODIMENTS OF THE INVENTION

Figure 1A:
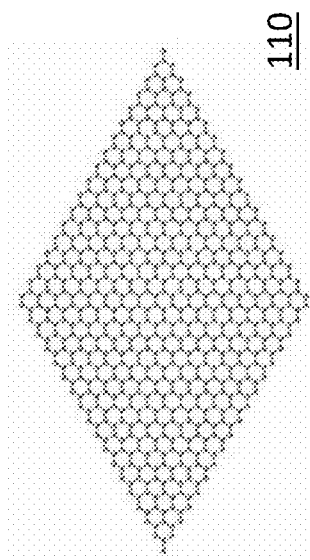
FIG. 1A illustrates a conventional graphene sheet 110.
Figure 1B:
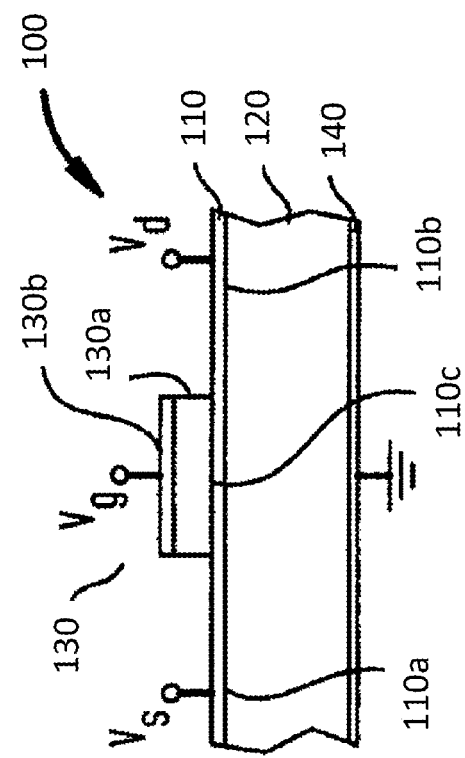
FIG. 1B illustrates a conventional field effect transistor 100.

Referring now to the drawings, FIGS. 2-14B illustrate some of the exemplary aspects of the present invention.

The present invention may provide a solution that generates bandgaps and provides stable rigid band doping in graphene. In an exemplary aspect of the present invention, a solution of the problems of conventional methods and devices includes creating a lattice of nanoholes in a two dimensional graphene sheet, passivating the dangling bonds in the nanoholes using various chemical elements, and using these elements to host other elements through, for example, strong binding chelation chemistry to stably n-dope or p-dope the graphene nanomeshes.

The ability to produce both types of semiconductor device (e.g., n-type devices and p-type devices) is important for to using graphene FETs in digital circuit applications. In addition, if the nanomesh forms a lattice, then the dopants will form a sublattice thereby allow control of dopant fluctuations.

An exemplary aspect of the present invention is directed to a doped, passivated graphene nanomesh (DP-GNM).

Another exemplary aspect of the present invention is directed to a semiconductor device including the DP-GNM, such as a graphene FET (e.g., a field effect transistor (e.g., a MOSFET) having a layer (e.g., a layer in the channel region) which includes the doped, passivated graphene nanomesh.

Another exemplary aspect of the present invention is directed to method of making the DP-GNM. The method may include controlling the doping level of the graphene nanomesh by using various dopants and passivations. In particular, the method may provide a new process which may enable both the creation of a bandgap to make graphene a semiconducting material, and controlling of the Fermi level to achieve n-type or p-type devices. Creating nanoholes in the graphene sheet will open a bandgap. The bandgap may be related to the size of the holes and to the lattice the holes form. The nanoholes may include dangling carbon bonds which will give states in the middle of the bandgap.

Still another exemplary aspect of the present invention is directed to ultra stable doping of a graphene sheet. MOSFET devices and CMOS logic may require stable doping which cannot be achieved using volatile surface dopants. Similarly, in scaling to very small dimension, concentration fluctuations of dopants critically affect performance and doping via molecules that can either electro-migrate or undergo hopping mass transport thermal excitation is not an effective strategy.

Unlike conventional methods, the present invention may provide stable doping and inhibit a fluctuation of the dopant concentration.

Figure 2:
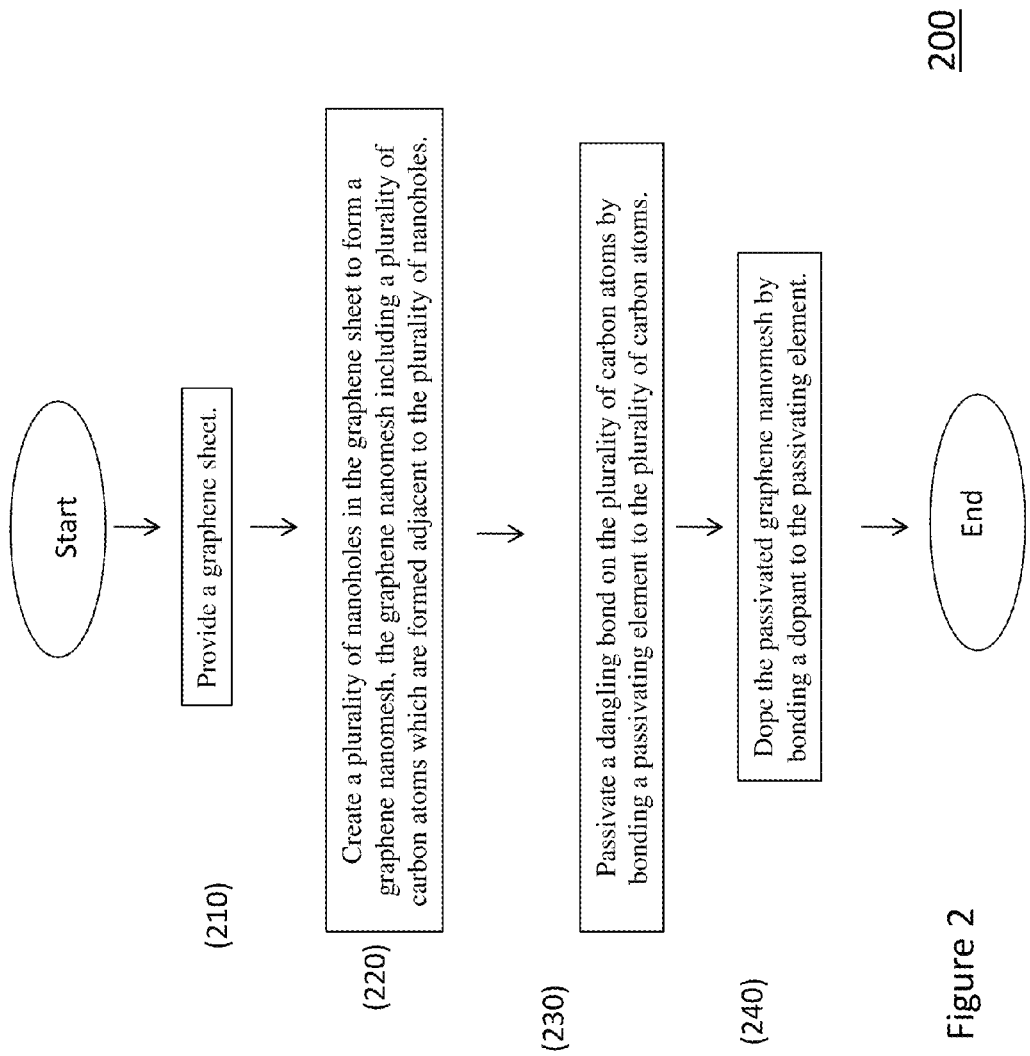
FIG. 2 illustrates a method 200 of making a semiconductor device, according to an exemplary aspect of the present invention.

Referring again to the drawings, FIG. 2 illustrates a method 200 of making a semiconductor device according to an exemplary aspect of the present invention. As illustrated in FIG. 2, the method 200 includes providing (210) a graphene sheet, creating (220) a plurality of nanoholes in the graphene sheet to form a graphene nanomesh, the graphene nanomesh including a plurality of carbon atoms which are formed adjacent to the plurality of nanoholes, passivating (230) a dangling bond on the plurality of carbon atoms by bonding a passivating element to the plurality of carbon atoms, and doping (240) the passivated graphene nanomesh by bonding a dopant to the passivating element.

For an n-doping of the passivated graphene nanomesh, the passivating element may include any element or compound that has a greater electron affinity than carbon (e.g., oxygen, nitrogen, etc.). For a p-doping of the passivated graphene nanomesh, the passivating element may include any element or compound that has a lesser electron affinity than carbon (e.g., boron, aluminum, etc.).

FIGS. 3A-3D illustrates the method 200 of making a semiconductor device (e.g., a doped, passivated graphene nanomesh (DP-GNM)). FIG. 3A illustrates the graphene sheet 310, and FIG. 3B illustrates the graphene nanomesh 320 including the nanohole 311 and the plurality of carbon atoms 312 which are formed adjacent to the nanohole 311, and dangling bonds 313 on the plurality of carbon atoms 312.

FIG. 3C illustrates the passivated graphene nanomesh 330 in which the dangling bonds 313 have been passivated with a passivating element 314 (e.g., oxygen).

FIG. 3D illustrates the doped, passivated graphene nanomesh (DP-GNM)) 340. As illustrated in FIG. 3D, the DP-GNM 300 includes the graphene nanomesh 320 including the nanohole 311 (e.g., a plurality of nanoholes) formed in a graphene sheet, and the plurality of carbon atoms 312 which are formed adjacent to the nanohole 311, the passivating element 314 (e.g., oxygen) bonded to the plurality of carbon atoms 312, and the dopant 315 (e.g., lithium) bonded to the passivating element 314.

It should be noted that the method 200 illustrated in FIGS. 3A-3D is exemplary and should not be considered as limiting the present invention. Indeed, another exemplary aspect of the present invention may be directed to a method of forming a semiconductor device which results in a DP-GNM formed by potassium ion chelation in which oxygen is the passivating element, and potassium is the dopant (e.g., see FIG. 7A).

Figures 4A, 4B:
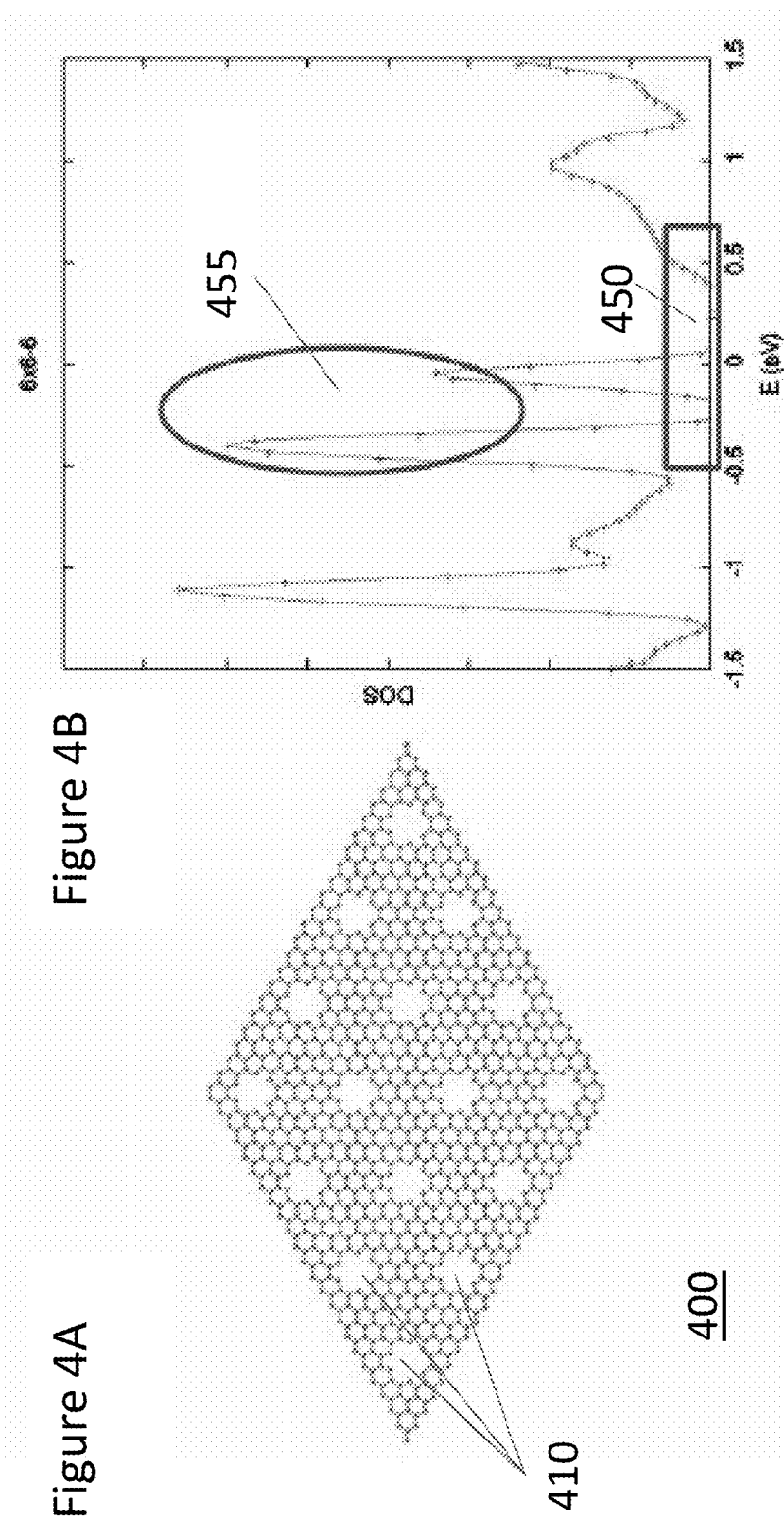
FIG. 4A illustrates a graphene nanomesh (GNM) 400, according to an exemplary aspect of the present invention.
FIG. 4B is a graph illustrating the density of states (DOS) of a graphene nanomesh (e.g., an unpassivated graphene nanomesh), according to an exemplary aspect of the present invention.

FIG. 4A illustrates a graphene nanomesh (GNM) 400 which includes a graphene lattice with a superimposed lattice of nanoholes 410, according to an exemplary aspect of the present invention. The nanoholes 410 in the GNM 400 include a pattern appropriate for the present invention. For example, the periodicity of the nanoholes may include a hole-hole separation given by $3 \times N \times A$, where N is an integer and A is the lattice constant for the lattice configuration.

It should be noted that the value of hole-hole separation of $3 \times N \times A$ may be used, for example, where the nanoholes have a circular (e.g., a substantially circular) cross-section. However, this value should not be considered as limiting. Indeed, the cross-section of the nanoholes may have other shapes, such as ellipsoidal, triangular, square, etc., and the hole-hole separation may have a value other than $3 \times N \times A$.

Further, it should be understood that clear that any description of the size of the nanoholes (e.g., the diameter of a cross section of one of the nanoholes) herein is merely exemplary and should in no way be considered as limiting. That is, for example, the size of the nanoholes may be greater than or less than the size of the nanoholes described herein. Therefore, the size of the dopant (e.g. potassium) should not pose a problem (e.g., should not distort the nanomesh structure or significantly modify the properties of the nanomesh).

FIG. 4B is a graph illustrating the density of states (DOS) of a graphene nanomesh (e.g., an unpassivated graphene nanomesh), according to an exemplary aspects of the present invention. The low energy spectrum exhibits a bandgap 450, with mid-gap states 455. These states are highly localized, and hence can severely hinder electronic transport.

However, the inventors discovered that such states can be removed by the passivation of the carbon atoms adjacent to the nanoholes in the graphene nanomesh, according to the exemplary aspects of the present invention.

Figure 5A:
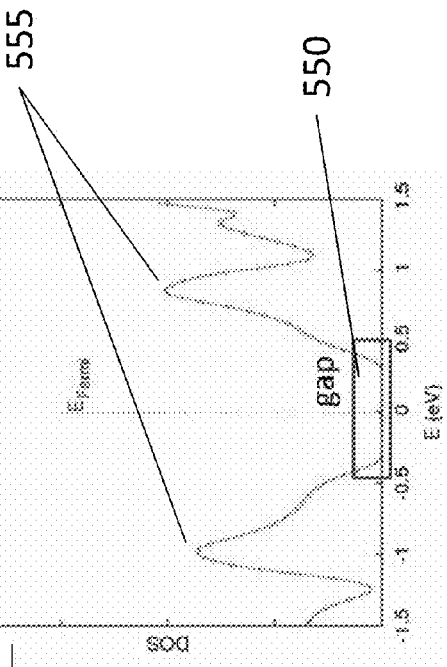
FIG. 5A illustrates a passivated graphene nanomesh 500 which includes a graphene nanomesh 510 which has been passivated which hydrogen atoms 520, according to an exemplary aspect of the present invention.

FIG. 5A illustrates a passivated graphene nanomesh 500 which includes a graphene nanomesh 510 which has been passivated which hydrogen atoms 520, according to an exemplary aspect of the present invention. The hydrogen states mix with the localized carbon ones, giving rise to states with energies away from the gap region.

Figure 5B:
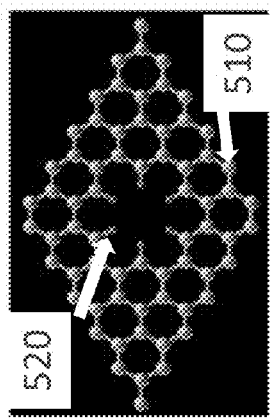
FIG. 5B illustrates the DOS of the passivated graphene nanomesh 500, according to an exemplary aspect of the present invention.

FIG. 5B illustrates the DOS of the passivated graphene nanomesh 500, and it can be seen that the midgap states 555 are shifted away from the bandgap 550. Therefore, the passivated GNM 500 may be considered to be an intrinsic semiconducting material. Examples of other elements that can be used to passivate GNMs include O, Te, K, B, and Cl.

Doping (e.g., Ultra-Stable Doping) of the Passivated GNMs

In an exemplary aspect of the present invention, doping of the GNMs is achieved chemically (e.g., via chemical vapor deposition (CVD)). This may offer very stable doping concentrations. For n-doping of the GNMs, a passivation is used that forms a binding site for an electron-donating element. An example would be using an oxygen passivation, with a potassium atom as the electron donating element. For p-doping of the GNMs, a passivation is used that forms a binding site for an electron-accepting element.

FIGS. 6A-B and 7A-B illustrate two examples for n-doping, and FIGS. 8A-B and 9A-B illustrate two examples of p-doping, according to an exemplary aspect of the present invention.

Figure 6A:
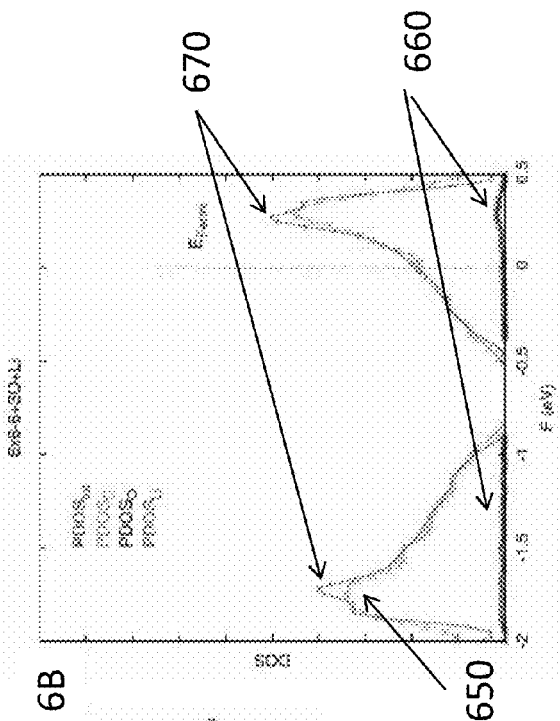
FIG. 6A illustrates a doped, passivated graphene nanomesh (DP-GNM) 600 formed by lithium ion chelation, according to an exemplary aspect of the present invention.

FIG. 6A illustrates a doped, passivated graphene nanomesh (DP-GNM) 600 formed by lithium ion chelation, according to an exemplary aspect of the present invention. In particular, the DP-GNM 600 includes a graphene nanomesh 610, including oxygen atoms as the passivating element 620, and lithium atoms as the dopant 630. This configuration gives an n-doped GNM.

Figure 6B:
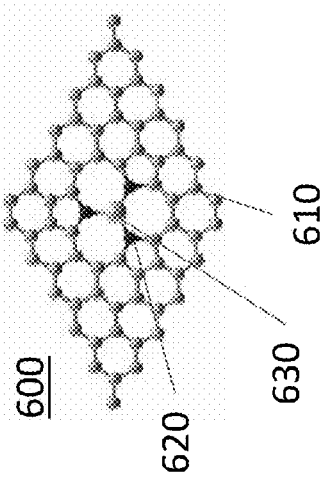
FIG. 6B provides a graph illustrating the DOS of the lithium-doped GNM 600, according to an exemplary aspect of the present invention.

FIG. 6B provides a graph illustrating the DOS of the lithium-doped GNM 600. The Fermi level is above the bandgap indicating the n-doping effect. The first plot 650 and the second plot 660 are the projected DOS of carbon and oxygen, respectively, and the third plot 670 is he projected total DOS (e.g., including the DOS of carbon, oxygen and lithium). As can be seen in FIG. 6B, the total DOS is dominated by the carbon contribution. This shows that neither lithium nor oxygen cause any scattering.

FIG. 7A illustrates a doped, passivated graphene nanomesh (DP-GNM) 700 formed by potassium ion chelation, according to an exemplary aspect of the present invention. In particular, the DP-GNM 700 includes a graphene nanomesh 710, including oxygen atoms as the passivating element 720, and potassium atoms as the dopant 730. This configuration gives an n-doped GNM.

FIG. 7B provides a graph illustrating the DOS of the potassium-doped GNM 700. The Fermi level is above the bandgap indicating the n-doping effect. The first plot 750 and the second plot 760 are the projected DOS of Carbon and Oxygen, respectively, and the third plot 770 is the total DOS (e.g., including the DOS of carbon, oxygen and potassium). As can be seen in FIG. 7B, the total DOS is dominated by the carbon contribution. This shows that neither potassium nor oxygen cause any scattering.

As we see in FIGS. 6A-B and 7A-B, both spectra are gapped. The Fermi level is in the conduction band. The carrier concentration for these structures (e.g., the DP-GNM 600 and the DP-GNM 700) is about $5 \times 10^{13}$ cm$^{-2}$. The projected DOS in both cases shows that the states above the bandgap are carbon states.

FIGS. 8A-B and 9A-B show two p-doping scenarios. In this case, the Fermi level is in the valence band. The carrier concentration is $1 \times 10^{14}$ cm$^{-2}$ for the CB$_6$ case and $1.5 \times 10^{14}$ cm$^{-2}$ for the Boron-Fluorine one.

FIG. 8A illustrates a CB$_6$ doped GNM 800 which includes a graphene nanomesh 810, including nitrogen atoms as the passivating element 820, and a CB$_6$ molecule as the dopant 830. This configuration gives a p-doped GNM. It should be noted that CB$_6$ may be prepared, for example, by the process described in K. Friess et.al., *Desalination* 200 (2006) 236-238, Section 2.1 (Synthesis of CB6).

FIG. 8B provides a graph illustrating the DOS of the CB$_6$-doped GNM 800. The Fermi level is below the gap indicating the p-doping effect. The first plot 850, second plot 860, and third plot 865 are the projected DOS of Carbon, Nitrogen, and Boron respectively, and the fourth plot 870 is the total DOS. As can be seen in FIG. 8B, the total DOS is still mainly arising from the carbon contribution, although less than in the cases described above in which the dopant was Potassium or Lithium. By lowering the doping level, one gets a projected DOS that is dominated by carbon.

FIG. 9A illustrates a boron-fluorine doped GNM 900 which includes a graphene nanomesh 910, including boron atoms as the passivating element 920, and fluorine atoms as the dopant 930. This configuration gives a p-doped GNM.

FIG. 9B illustrates the DOS of the Boron-Fluorine-doped GNM 900. The Fermi level is below the gap indicating the p-doping effect. The first plot 950, second plot 960, and third plot 965 are the projected DOS of carbon, boron, and fluorine respectively, and the fourth plot 970 is the projected total DOS (e.g., including the DOS of carbon, boron, and fluorine). As can be seen in FIG. 9B, the total DOS is still mainly arising from the carbon contribution despite the boron contribution. Thus, by lowering the doping level, one gets a projected DOS that is dominated by carbon.

There may be several methods of controlling the level of doping. One method of controlling the level of doping is to passivate all nanoholes but doping only a fraction of them. Another method of controlling the level of doping is by controlling the lattice constant of the nanoholes. Increasing the lattice constant of the nanohole lattice will decrease the doping level.

FIG. 10A illustrates a potassium-doped (e.g., n-doped) GNM 1000 with twice the nanohole lattice constant of the potassium-doped GNM 700 illustrated in FIG. 7A. The potassium-doped GNM 1000 has a doping level of about $1.2 \times 10^{13}$ cm$^{-2}$.

FIG. 10B provides a graph illustrating the DOS of the potassium-doped GNM 1000. The graph illustrates the effect of lesser doping (compared to the potassium-doped GNM 700) on the spectrum.

Mobility in Doped, Passivated GNMs

The mobility in doped, passivated GNMs can be estimated using two quantities. The first quantity is the degree of state delocalization of the eigenstates of the doped, passivated GNM. This may be quantified using the participation ratio (PR) of the states. This quantity probes the average amplitudes of the eigenstates on different localized orbitals.

FIG. 11 provides a graph including a first plot 1180 which plots the participation ratio for a n-doped GNM system, and a second plot 1190 which plots the participation ratio for pristine graphene. As can be seen in FIG. 11, there is a factor of ½ between the GNM participation ratio and that of graphene (e.g., the PR of the GNM is approximately half that of graphene), which indicates that the GNM mobility is still on the order of that of graphene.

Another quantity that can be used to probe the mobility in the doped, passivated GNMs is the Fermi velocity of the carriers. FIG. 12A provides a graph illustrating the band structure of an n-doped passivated GNM. The Fermi energy is marked by the dotted line in FIG. 12A. The Fermi velocity for the n-doped passivated GNM is substantially equal to that of pristine graphene.

FIG. 12B provides a graph in which the Fermi velocity of the electrons (e.g., for graphene and the n-doped passivated GNM) is plotted as a function of energy. The dotted vertical line in FIG. 12B indicates the Fermi energy of the GNM. FIG. 12B more clearly illustrates that the Fermi velocity for the n-doped passivated GNM is approximately equal to that of pristine graphene. The first plot 1295 is for the doped passivated GNM, while the second plot 1297 is for pristine graphene. As can be seen in FIG. 12B, except for the vicinity of the gap of the GNM, the Fermi velocities are substantially equal.

Figure 13:
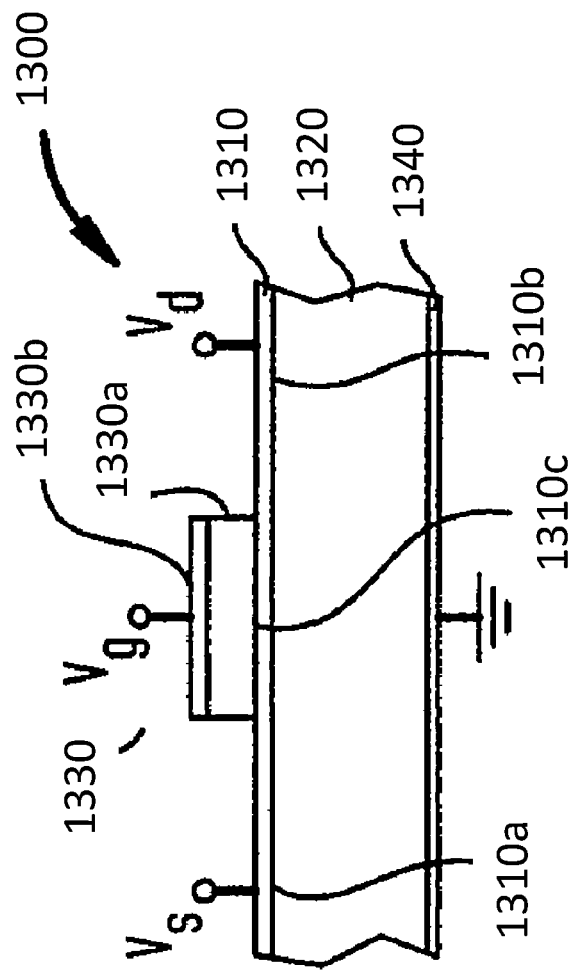
FIG. 13 illustrates a field effect transistor (FET) 1300, according to an exemplary aspect of the present invention.

FIG. 13 illustrates a field effect transistor (FET) 1300, according to an exemplary aspect of the present invention. The FET 1300 may be similar to the conventional FET 100, except that the FET 1300 includes a doped, passivated GNM layer 1310 instead of the graphene layer 110, In particular, in the FET 1300, the doped, passivated GNM layer 1310 may be formed by growing a graphene sheet on (e.g., epitaxially forming the graphene sheet on) a single crystal insulative layer 1320 to which the graphene sheet 1310 is lattice-matched. The graphene sheet may then be processed above to form the doped, passivated GNM (e.g., DP-GNM 500, DP-GNM 600, DP-GNM 700, DP-GNM 800, DP-GNM 900, DP-GNM 1000, etc.).

Separate portions of layer 1310 form source region 1310a and drain region 1310b. Schematically depicted source and drain electrodes $V_s$ and $V_d$, respectively, make electrical contact with source and drain regions 1310a and 1310b. A third portion of layer 1310 forms a channel region 1310c, which couples the source and drain regions to one another. The channel region 1310c may include, for example, a doped graphene layer.

Further, the resistance/conductance of the channel region 1310c is controlled by a gate 1330 which may include a patterned gate insulator 1330a disposed on channel region 1310c and a gate electrode 1330b formed on gate insulator 1330a. A common electrode 1340 is formed on the bottom of insulative layer 1320.

Similar to the operation of the FET 100, in the FET 1300, when suitable voltages $V_s$ and $V_d$ are applied to the source and drain electrodes, respectively, current flows or is inhibited from the source region 1310a to the drain region 1310b (or conversely) depending on the gate voltage applied between electrodes 1330b and 1340. When the gate voltage $V_g$ is sufficient to reduce electron transport by depleting the channel region 1310c, the channel resistance increases and current flow decreases, and conversely.

It should be noted that the application of the doped, passivated graphene nanomesh (DP-GNM) according to the present invention is not limited to use in the field effect transistor 1300. Indeed, the DP-GNM may be used in any device which exploits the properties of semiconducting materials. For example, the DP-GNM may be used in lieu of conventional semiconductor layers (e.g., doped silicon layers) in diodes, bipolar junction transistors, photocells, solar cells, etc.

Gating of Doped Passivated GNMs

Figure 14A:
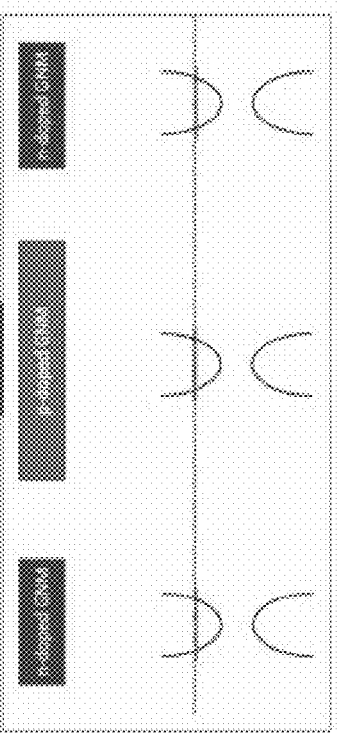
FIG. 14A provides a schematic diagram of a MOSFET device (e.g., the FET 1300 including a doped, passivated GNM) in an OFF state, according to an exemplary aspect of the present invention.
Figure 14B:
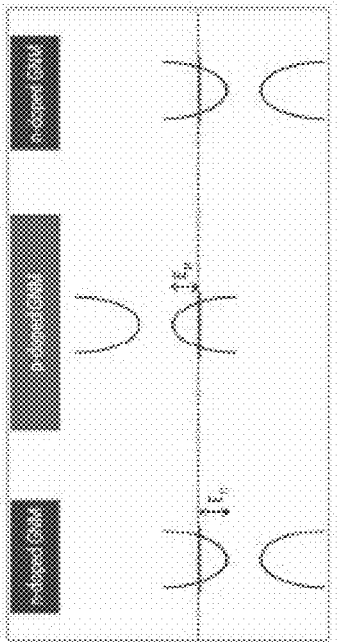
FIG. 14B provides a schematic diagram of a MOSFET device (e.g., the FET 1300 including a doped, passivated GNM) in an ON state, according to an exemplary aspect of the present invention.

FIGS. 14A-B provide schematic diagrams for a MOSFET device (e.g., FET 1300) based on a doped, passivated GNM. As illustrated in FIG. 14A, the device is in the OFF state when the gate voltage is zero ($V_G=0$), and as illustrated in FIG. 14B, the device is switched on by applying a positive gate voltage ($V_G>0$) (e.g., applying a positive gate voltage opens an n-channel switching the MOSFET to the ON state).

The gate voltage ($V_G$) (e.g., the voltage needed to open an n-channel of a MOSFET device) may be estimated as follows: Assuming that the n and p sections of the MOSFET device have equal carrier densities, then the gate voltage, $V_G$, which is needed to open an n-channel in the device is given by:

$$V_G = V_{ox} + 1/e(E_g + E_p + E_n), \quad \text{(Equation 1)}$$

where $E_n(E_p)$ is measured from the position of the Fermi level in the n-doped (p-doped) region to the bottom (top) of the conduction (valence) band. The gap energy $E_g$ is typically 0.3 eV, while $E_n$ and $E_p$ are in the range of 0.2 eV for doping levels shown above (e.g., $1.2 \times 10^{13}$ cm$^{-2}$).

Further, a 50% doping of the nanoholes ($\sim 6 \times 10^{12}$ cm$^{-2}$) is assumed. Using a ~5 nm oxide layer with a dielectric constant of ~50, $V_{ox}$ is about 0.1 V. Therefore, based on Equation 1 (above) the gate voltage $V_G$ needed to open an n-channel of a MOSFET device can be estimated to be about 0.6 V.

In summary, the exemplary aspects of the present invention are based on using a specific modification of graphene sheets, which results in a qualitative change in its electronic properties. The modified graphene is then subjected to two other chemical changes that result in a system that can be used for a CMOS application.

Some important characteristics of the doped, passivated graphene nanomesh (DP-GNM) are as follows:

1. A modified graphene may be used as the base material in an exemplary aspect of the present invention. This may be done by creating holes in the graphene sheet through the removal of certain regions (e.g., not necessarily single atoms). The material (e.g., graphene sheet with a plurality of nanoholes) may be referred to as a graphene nanomesh (GNM).
2. The exemplary aspects of the present invention (e.g., the DP-GNM) may include a specific periodicity that leads to certain electronic properties (opens up gaps in the electronic spectrum). This periodicity may be characterized by a hole-hole separation of "3×N×A", where "N" is an integer, and "A" is the graphene lattice constant.
3. The exemplary aspects of the present invention may passivate the borders of the created nanoholes with a passivating element (such as, but not limited to, O, B, N . . . etc).
4. The exemplary aspects of the present invention may dope the passivated GNM in such a manner (e.g., using CVD) that the dopants chemically bind to the borders of the nanoholes. An effect of such doping is to shift the Fermi level of the system (e.g., the DP-GNM) from the middle of the bandgap (e.g., yielding a metallic system) without significantly distorting the intrinsic electronic spectrum (e.g., rigid band doping). As a result, the bandgap survives the doping of the GNM, giving a system (e.g., a DP-GNM) that can be electrostatically gated off to the gap region.
5. The exemplary aspects of the present invention may use combinations of the above described n-doped and p-doped passivated GNMs as a CMOS device.

Further, it should be noted that although the embodiments described above focus on a DP-GNM having a uniform lattice pattern of nanoholes, uniform passivating elements, uniform dopants, and uniform doping levels, the DP-GNM may have plural regions which may include a different lattice pattern of nanoholes, different passivating elements, different dopants and different doping levels. For example, one DP-GNM (e.g., including a single graphene sheet) may include a first region (e.g., an n-type region) having a lattice constant, L, with oxygen as the passivating element and potassium as the dopant, and having a doping level of about $6 \times 10^{12}$ cm$^{-2}$, and a second region (e.g., a p-type region) having a lattice constant of L, with nitrogen as the passivating element, and with $CB_6$ as the dopant, a third region (e.g., an n-type region) having a lattice constant, 2L, with a oxygen as the passivating element and potassium as the dopant, and having a doping level of about $1.2 \times 10^{13}$ cm$^{-2}$, and so on.

With its unique and novel features, the present invention may provide a method of making a semiconductor device including a doped, passivated graphene nanomesh, which may provide ultra-stable doping of the graphene nanomesh.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of making a semiconductor device, comprising:
    providing a graphene sheet;
    creating a plurality of nanoholes in the graphene sheet to form a graphene nanomesh, the graphene nanomesh including a plurality of carbon atoms which are formed adjacent to the plurality of nanoholes;
    passivating a dangling bond on the plurality of carbon atoms by bonding a passivating element to the plurality of carbon atoms; and
    doping the passivated graphene nanomesh by bonding a dopant to the passivating element, the dopant comprising one of an electron-donating element for making the graphene nanomesh an n-doped graphene nanomesh, and an electron-accepting element for making the graphene nanomesh a p-doped graphene nanomesh,
    wherein the dopant comprises a metal atom and the bonding of the dopant to the passivating element comprises a chelation process in which the metal atom is bonded to an atom of the passivating element such that a ring is formed in a hole of the plurality of nanoholes, the ring comprising the atom of the passivating element, the metal atom, and a carbon atom of the plurality of carbon atoms.

2. The method of claim 1, wherein the doping of the graphene nanomesh comprises controlling an amount of atoms of the dopant which are bonded to the passivating element.

3. The method of claim 2, wherein the lattice configuration of the plurality of nanoholes includes a periodicity for opening a band gap in an electronic spectrum of the nanomesh.

4. The method of claim 1, wherein the plurality of nanoholes comprises a lattice configuration.

5. The method of claim 4, wherein the periodicity comprises a hole-hole separation given by 3×N×A, where N is an integer and A is the lattice constant for the lattice configuration.

6. The method of claim 1, wherein one of:
the passivating element comprises an element or compound that has a greater electron affinity than carbon; and
the passivating element comprises an element or compound that has a lesser electron affinity than carbon.

7. The method of claim 1, wherein the doping of the graphene nanomesh comprises chemically doping the graphene nanomesh.

8. The method of claim 1, wherein the doping of the graphene nanomesh comprises n-doping the graphene nanomesh, and the dopant comprises an electron-donating element.

9. The method of claim 8, wherein the passivating element comprises oxygen and the electron-donating element comprises lithium.

10. The method of claim 8, wherein the passivating element comprises oxygen and the electron-donating element comprises potassium.

11. The method of claim 1, wherein the doping of the graphene nanomesh comprises p-doping the graphene nanomesh, and the dopant comprises an electron-accepting element.

12. The method of claim 11, wherein the passivating element comprises nitrogen and the electron-accepting element comprises $CB_6$.

13. The method of claim 11, wherein the passivating element comprises boron and the electron-accepting element comprises fluorine.

14. The method of claim 1, wherein the doping of the graphene nanomesh comprises controlling a level of doping by passivating all of the plurality of nanoholes and doping less than all of the passivated plurality of nanoholes.

15. The method of claim 1, wherein the doping of the graphene nanomesh comprises controlling a level of doping by controlling a lattice constant of the plurality of nanoholes.

16. The method of claim 1, wherein the passivating of the graphene nanomesh comprises passivating the graphene nanomesh such that a midgap state of the graphene nanomesh is shifted away from a bandgap, and the passivated graphene nanomesh comprises an intrinsic semiconducting material.

17. The method of claim 1, wherein the doping of the passivated graphene nanomesh comprises doping the passivated graphene nanomesh such that a total density of states (DOS) for the doped passivated graphene nanomesh is mainly arising from a carbon contribution.

18. The method of claim 1, wherein the doping of the passivated graphene nanomesh comprises shifting a Fermi level of the passivated graphene nanomesh from a middle of a bandgap without significantly distorting an intrinsic electronic spectrum of the passivated graphene nanomesh.

19. The method of claim 1, wherein the doping of the passivated graphene nanomesh comprises doping the passivated graphene nanomesh such that the doped passivated graphene nanomesh can be electrostatically gated off to a bandgap region.

20. A method of making a doped, passivated graphene nanomesh, comprising:
providing a graphene sheet;
creating a plurality of nanoholes in the graphene sheet to form a graphene nanomesh, the graphene nanomesh including a plurality of carbon atoms which are formed adjacent to the plurality of nanoholes, the plurality of nanoholes including a lattice configuration having a periodicity for opening a band gap in an elecronic spectrum of the nanomesh, and the periodicity comprising a hole-hole separation given by 3×N×A, where N is an integer and A is the lattice constant for the lattice configuration;
passivating a dangling bond on the plurality of carbon atoms by bonding a passivating element to the plurality of carbon atoms; and
doping the passivated graphene nanomesh by bonding a dopant to the passivating element, the dopant comprises a metal atom and the bonding of the dopant to the passivating element comprising a chelation process in which the metal atom is bonded to an atom of the passivating element such that a ring is formed in a hole of the plurality of nanoholes, the ring including the atom of the passivating element, the metal atom, and a carbon atom of the plurality of carbon atoms,
wherein the dopant comprises one of an electron-donating element for making the graphene nanomesh an n-doped graphene nanomesh, and an electron-accepting element for making the graphene nanomesh a p-doped graphene nanomesh,
wherein the doping of the graphene nanomesh comprises controlling a level of doping by one of:
passivating all of the plurality of nanoholes and doping less than all of the passivated plurality of nanoholes; and
controlling a lattice constant of the plurality of nanoholes.

* * * * *